(12) United States Patent
Sezginer et al.

(10) Patent No.: US 7,568,174 B2
(45) Date of Patent: Jul. 28, 2009

(54) METHOD FOR CHECKING PRINTABILITY OF A LITHOGRAPHY TARGET

(75) Inventors: Abdurrahman Sezginer, Monte Sereno, CA (US); Bayram Yenikaya, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 211 days.

(21) Appl. No.: 11/504,928

(22) Filed: Aug. 16, 2006

(65) Prior Publication Data
US 2007/0094634 A1 Apr. 26, 2007

Related U.S. Application Data

(60) Provisional application No. 60/709,881, filed on Aug. 19, 2005.

(51) Int. Cl.
*G06F 17/50* (2006.01)
(52) U.S. Cl. .................. 716/4; 716/19; 716/21
(58) Field of Classification Search ............... None
See application file for complete search history.

(56) References Cited

U.S. PATENT DOCUMENTS

| | | | | | |
|---|---|---|---|---|---|
| 6,032,106 | A * | 2/2000 | Ishii | .................. | 702/85 |
| 6,700,095 | B2 | 3/2004 | Sandstrom et al. | .......... | 219/121 |
| 6,928,634 | B2 * | 8/2005 | Granik et al. | .................. | 716/19 |
| 7,062,729 | B2 * | 6/2006 | Gray et al. | ............ | 716/3 |
| 7,237,221 | B2 * | 6/2007 | Granik et al. | .................. | 716/19 |
| 7,245,354 | B2 * | 7/2007 | Granik | .................. | 355/67 |
| 7,269,804 | B2 * | 9/2007 | Tabery et al. | ............ | 716/4 |
| 7,269,817 | B2 * | 9/2007 | Heng et al. | ............ | 716/21 |
| 7,313,508 | B2 * | 12/2007 | Croffie et al. | .......... | 703/14 |
| 2005/0251771 | A1 * | 11/2005 | Robles | ............ | 716/5 |
| 2006/0253810 | A1 * | 11/2006 | Guardiani et al. | ............ | 716/4 |

OTHER PUBLICATIONS

Choi et al., "Simulation-Based Critical Area Extraction And Litho-Friendly Layout Design For Low k1 Lithography," Proceedings of SPIE, vol. 5377, p. 713-720, SPIE Bellingham, WA, 2004.
Pablo A. Parrilo and Sanjay Lall, "Linear Inequalities and Elimination," Workshop presented at the 42nd IEEE Conference on Decision and Control, Maui HI, USA, Dec. 8, 2003, pp. 5-1 thru 5-29.

(Continued)

*Primary Examiner*—Leigh Marie Garbowski
(74) *Attorney, Agent, or Firm*—Sheppard Mullin Richter & Hampton LLP

(57) ABSTRACT

A technique for determining, without having to perform optical proximity correction, when the result of optical proximity correction will fail to meet the design requirements for printability. A disclosed embodiment has application to a process for producing a photomask for use in the printing of a pattern on a wafer by exposure with optical radiation to optically image the photomask on the wafer. A method is set forth for checking the printability of a target layout proposed for defining the photomask, including the following steps: deriving a system of inequalities that expresses a set of design requirements with respect to the target layout; and checking the printability of the target layout by determining whether the system of inequalities is feasible.

33 Claims, 3 Drawing Sheets

OTHER PUBLICATIONS

Karmarkar, N. "A New Polynomial-Time Algorithm for Linear Programming" ACM, 302-311, 1984.
S. Mehrotra, "On The Implementation of A Primal-dual Interior Point Method," SIAM Journal on Optimization, 2, pp. 575-601, 1992.
Stephen P. Vernon, et al., "Masks for Extreme Ultraviolet Lithography," Proc. SPIE vol. 3546, p. 184-193, Dec. 1998, SPIE Press, Bellingham, WA.
Choi et al., "Illumination And Multi-Step OPC Optimization To Enhance Process Margin Of The 65nm Node Device Exposed By Dipole Illumination," Proceedings of SPIE vol. 5754, SPIE Bellingham, VA, 2005.
Hong et al., "New OPC Methods To Increase Process Margin For Sub-70nm Devices," Proceedings of SPIE vol. 5756, SPIE Bellingham, WA, 2005.

* cited by examiner

METHOD FOR CHECKING PRINTABILITY OF A LITHOGRAPHY TARGET

RELATED APPLICATION

Priority is claimed from U.S. Provisional Patent Application No. 60/709,881, filed Aug. 19, 2005, and said Provisional Patent Application is incorporated herein by reference.

FIELD OF THE INVENTION

This invention relates to the field of fabrication of integrated circuits and, more particularly, to the checking for printability of a lithography target used in the production of integrated circuits.

BACKGROUND OF THE INVENTION

Patterns in an integrated circuit are designed according to requirements of circuit performance, layout and routing. The output of layout and routing is a set of target polygons that are input to photomask design. The goal of photomask design is to minimize the difference between the pattern that will be rendered on the wafer, and the target pattern, for a sufficiently large process window. Process window refers to a region in the exposure dose-defocus plane on which one or more critical dimension of a pattern is printed within an acceptable tolerance. Photomask design is an optimization process. Resolution enhancement techniques (RET) and optical proximity corrections (OPC) are techniques that are used to optimize the photomask for a given target pattern.

An important consideration in chip design is that not every pattern can be rendered by lithography. It is entirely possible to specify a target pattern that is not printable, or printable with an unacceptably narrow process window, using a specific lithography process.

Layout and routing is constrained by a set of geometric design rules. For example, design rules may include minimum line width, minimum space width, disallowed combinations of line and space widths. Conformance of a target pattern to design rules is performed by a design rule check (DRC) software, which is based on geometry operations. A set of design rules is specific to a certain combination of wavelength, numerical aperture of the lithography projector, illumination condition, and photoresist. Design rules are selected to ensure that if a pattern conforms to the design rules, the pattern will be printable with a sufficient process window.

However, design-rule checking of the prior art has deficiencies and limitations, including the following: (1) there is no guarantee that a finite set of geometric rules can predict printability of countless two-dimensional patterns; (2) if design rules ensure printability, they may be overly conservative and may lead to increased chip size; (3) designers may choose to violate design rules to achieve a higher density of devices, for example in an SRAM design.

If design rules are bypassed or design rules unwittingly allow a pattern that is not printable, RET and OPC can be thrown into an endless loop. If an RET/OPC approach fails to achieve a desired target pattern and process window, the natural reaction of the RET/OPC engineer is to change the parameters of optimization, or to consider different RET schemes. This process can waste precious design time because prior art RET/OPC cannot definitively state that a certain target is unprintable irrespective of photomask technology at a given wavelength and numerical aperture (NA).

The prior art includes determination of printability after applying optical proximity corrections to the photomask layout (see: Choi et al., Proceedings of SPIE, Vol. 5377, p. 713-720, SPIE Bellingham, Wash., 2004).

It is among the objects of the present invention to provide a technique for determining when the result of optical proximity corrections will fail to meet the design requirements, without having to perform the optical proximity corrections. It is also among the objects of the present invention to improve on existing techniques for checking the printability of a lithography target layout. [As used herein, "printability" of a target layout means that when the layout is employed in projecting an image on the wafer, the pattern that is printed (for example, on a photoresist film coating of a wafer) by exposure with optical radiation, has acceptable tolerances.]

SUMMARY OF THE INVENTION

The invention provides, inter alia, a technique for determining, without having to perform optical proximity correction, when the result of optical proximity correction will fail to meet the design requirements for printability.

An embodiment of the invention has application to a process for producing a photomask (e.g. a transmissive or reflective type of photomask) for use in the printing of a pattern on a wafer by exposure with optical radiation to optically image the photomask on the wafer. [As used herein, "optical radiation" means light having wavelength within or outside the visible, used to obtain exposure of a film, for example a photoresist film.] In accordance with this embodiment, a method is set forth for checking the printability of a target layout proposed for defining said photomask, including the following steps: deriving a system of inequalities that expresses a set of design requirements with respect to the target layout; and checking the printability of said target layout by determining whether said system of inequalities is feasible.

An embodiment of the invention further comprises dividing said target layout into parts, and the step of determining the printability of the target layout comprises determining the printability of said parts of the target layout.

In an embodiment of the invention, the photomask is for printing of a pattern on a film on said wafer, and variations in the exposure dose of target points of the pattern are represented by dose latitude in said system of inequalities. In a form of this embodiment, a determination is made of a dose latitude for which at least part of the target layout is printable.

In an embodiment of the invention, said system of inequalities includes the wavelength of the optical radiation. Also this embodiment, the optical radiation is produced by a projector having objective optics and a numerical aperture of its projection objective, and said system of inequalities includes said numerical aperture, and also includes the depth of field of the projector optics. Further in this embodiment, said system of inequalities includes edge-placement tolerance of the pattern associated with the target layout. Also, a form of this embodiment includes determination of an edge-placement tolerance for which at least part of said target pattern is printable.

In an embodiment of the invention, the step of checking the printability of said target layout is performed before performing at least one of the following changes to said target layout: applying an optical proximity correction; adding a sub-resolution feature; or assigning a phase-shift to a feature. In a form of this embodiment, the step of checking the printability of said target layout is performed before an illumination condition of the photolithography projector is determined.

A further embodiment of the invention includes the following steps: providing a plurality of processors; and dividing said step of determining the printability of said target layout among said plurality of processors, whereby different processors determine the printability of different parts of said target layout.

An embodiment of the invention has application to the fabrication of integrated circuits that includes a process for producing a photomask for use in the printing of a pattern on a photoresist film which coats at least part of a semiconductor wafer, by exposure with optical radiation from a projector to optically image the photomask on the wafer. A method is set forth for checking the printability of a target layout proposed for defining said photomask, including the following steps: deriving a system of inequalities that expresses a set of design requirements with respect to the target layout; dividing said target layout into parts; and checking the printability of said parts of said target layout by determining whether said system of inequalities is feasible. In a form of this embodiment, said checking is performed during layout or routing of an integrated circuit. In a further form of this embodiment, the layout or routing is modified until printability is achieved.

The invention also has application to mask-less lithography and immersion lithography. An embodiment hereof is broadly directed to a process for printing of a pattern on a wafer by optically projecting an image on the wafer. In accordance with this embodiment, a method is set forth for checking the printability of a target layout proposed for defining said pattern, including the following steps: deriving a system of inequalities that expresses a set of design requirements with respect to the target layout; and checking the printability of said target layout by determining whether said system of inequalities is feasible.

Further features and advantages of the invention will become more readily apparent from the following detailed description when taken in conjunction with the accompanying drawings.

DETAILED DESCRIPTION

The terms "karo", "target points," and "normal vectors" are used in the description, and will first be defined.

Techniques hereof check a small region of the target layer at a time. This region is called a karo. The union of karos cover the chip, or the part of the layout to be checked. Karos may overlap. Karos are rectangular in a preferred embodiment, although in alternative embodiments they can have any shape. The preferred size of a karo is between 0.5 and 2 micrometers for 193 nm exposure wavelength.

In a given karo, target points $r_1, r_2, \ldots, r_M$ are selected on the edges of target polygons. The target points are used to help encapsulate the design requirements by a mathematical expression. In an embodiment hereof, target points on a polygon are approximately equally spaced by a distance of ($k_{SAMPLE}$ $\lambda$/NA), where $k_{SAMPLE}$ is a dimensionless factor that is less than 0.25 and preferably larger than 0.1; $\lambda$ is the exposure wavelength, and NA is the numerical aperture of the lithography projector. In a preferred embodiment hereof, target points are not placed on vertices of target polygons because sharp corners are not printable.

Figure 1:
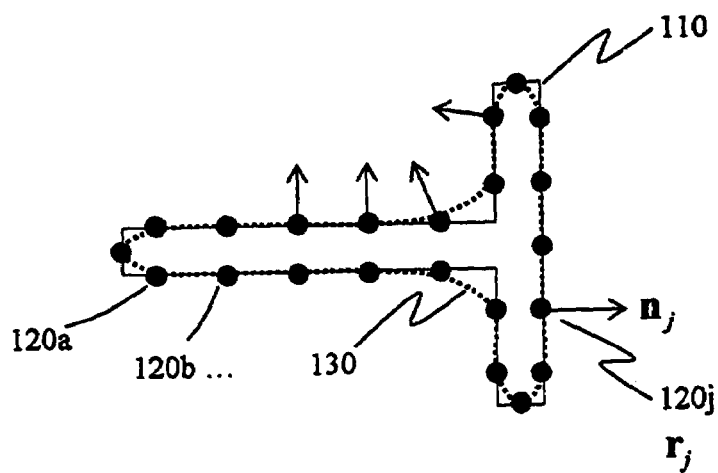
FIG. 1 is a schematic diagram showing a target polygon, target points, and some normal vectors.

In an embodiment hereof, a two-dimensional normal vector $n_j$ is assigned to each target point $r_j$. The normal vector is substantially perpendicular to the edge of the target polygon or the expected wafer pattern. The normal vector points in the direction of increasing image intensity. FIG. 1 shows a target polygon 110. In a preferred embodiment, target points 120a, 120b, ..., 120j, ... are placed on a curve 130 that fits the target polygon 110 except at the vertices. The unit vector that is perpendicular to the tangent of curve 130 at target point 120j is $n_j$. In an alternative embodiment, the target points are placed on the target polygon 110 avoiding its vertices, and the unit vector $n_j$ is perpendicular to the edge of the target polygon at target point 120j.

In the following portion of the description, the design requirements for a preferred embodiment will be described in mathematical terms. No process parameter can be held absolutely constant. There is an acceptable range of variation for any quantity that one wishes to keep constant. Let ($\Delta$dose) be the accepted range of exposure dose variability. Dose variations can be caused by changes in the thickness, refractive index, or extinction coefficient of the photoresist, or any other film on the wafer. Dose variations can also be caused by temporal or spatial nonuniformity of the exposure intensity. Variations in the post-exposure-bake temperature (PEB) can alter the dose threshold at which the resist dissolves upon development. Therefore, variations in the PEB temperature are equivalent to a dose variation.

A goal of design for manufacturability (DFM) is to keep the edge of the pattern that will be printed on the wafer within an acceptable tolerance $\Delta e$ of each target point when dose varies by $\Delta$dose. This requirement can be expressed as a set of inequalities:

$$U(r_j + \Delta e_j n_j) \geq \frac{t}{1 - \frac{\Delta dose}{dose}}; \quad j = 1, 2, \ldots, M \quad (1)$$

$$U(r_j - \Delta e_j n_j) \leq \frac{t}{1 + \frac{\Delta dose}{dose}}; \quad j = 1, 2, \ldots, M$$

In the above system of inequalities, U(r) is the latent image intensity at a point $r \in R^2$ in the plane of the wafer; $n_j$ is the unit normal of the pattern edge at the $j^{th}$ target point $r_j$; t is a threshold in the units of image intensity such that the resist at r dissolves if U(r)>t and does not dissolve if U(r)<t. The inequalities above ensure that the resist edge will not deviate more than a distance of $\Delta e_j$ from the target point $r_j$ when the dose changes by a fractional amount $\pm \Delta$dose/dose. The first line in Equation (1) ensures that the edge-placement tolerance is met when the wafer is under exposed by $\Delta$dose. The second line in Equation (1) ensures that the edge-placement tolerance is met when the wafer is over exposed by $\Delta$dose.

To give a numerical example, the specification can be $\Delta e=5$ nm for $\Delta$dose/dose=5%. This specification ensures that critical dimension (line width) will not change by more than $\pm 10$ nm, and the contribution of the present layer to overlay will not exceed $\pm 5$ nm, when the dose changes by $\pm 5\%$.

In a preferred embodiment, the edge placement tolerance $\Delta e_j$ can be different for each target point $r_j$. For example, in a gate layer of a CMOS ULSI chip, the edge-placement tolerance can be tighter (smaller) at the edges that define the gate-lengths of transistors on a critical circuit, and $\Delta e_j$ can be larger at the edges of interconnections in the field poly-silicon. The tolerances can be tighter at the edges of contact landing pads whose placement is critical for overlay. The tolerances can be derived from Boolean operations on patterns at multiple layers and user-specified rules. In an alternative embodiment, all edge tolerances $\Delta e_j$ are the same.

Inequality (1) encapsulates the design goals regarding the geometry of the desired pattern to be formed in photoresist, the edge placement tolerance, and the required dose latitude.

The latent image intensity is band-limited in the spatial-frequency domain, or equivalently, wave-number domain. The latent image can be expressed as a 2-dimensional Fourier integral:

$$U(r) = \int \exp(ik \cdot r) \hat{U}(k) d^2 k \qquad (2)$$

The Fourier transform variable $k \in R^2$ is a 2-dimensional wave-vector, and the integral is taken over the entire 2-dimensional Euclidian space, and $\hat{U}(k)$ is the Fourier transform of $U(r)$. The support of $\hat{U}(k)$, that is the closure of the set over which $\hat{U}(k)$ takes non-zero values, is:

$$\text{Supp}\{\hat{U}\} = \{k \mid \|k\| \leq k_{MAX}\} \qquad (3)$$

$$k_{MAX} = 4\pi NA/\lambda \qquad (4)$$

Equation (4) expresses that the period of the highest spatial-frequency pattern that can be printed by an optical lithography projector is $\lambda/(2NA)$.

If the pattern periodically repeats, then the latent image is a spatially-periodic pattern. In this case, the Fourier integral in Equation (2) reduces to a Fourier series with finitely many terms as shown in Equation (5a). Any portion of an arbitrary pattern can be approximated by a periodic pattern for the purposes of image calculation, by stepping and repeating the portion of interest and some buffer zone around it.

$$U(r) = \sum_{m=-M}^{M} \sum_{\substack{n=-N \\ \|k_{mn}\| \leq k_{MAX}}}^{N} \{\alpha_{mn} \cos(k_{mn} \cdot r) + \beta_{mn} \sin(k_{mn} \cdot r)\} \qquad (5a)$$

$$k_{mn} = 2\pi \left(\frac{m}{\Lambda_x}, \frac{n}{\Lambda_y}\right)$$

$$M = \text{ceil}(\Lambda_x k_{MAX}/(2\pi))$$

$$N = \text{ceil}(\Lambda_y k_{MAX}/(2\pi))$$

In Equation (5a), $\alpha_{mn}$ and $\beta_{mn}$ are real-valued Fourier coefficients; $\Lambda_x$ is the period in the x-direction; $\Lambda_y$ is the period in the y-direction; m and n are integer indices; ceil(x) stands for the smallest integer that is greater than or equal to x; and $k_{mn} \cdot r$ denotes the inner-product of the vectors $k_{mn}$ and r. Although it is not explicitly stated in Equation (5a), it is understood that only linearly independent combinations of $\sin(k_{mn} \cdot r)$ and $\cos(k_{mn} \cdot r)$ are taken in the double summation. That is, if (m,n) is taken in the summation, (−m,−n) is not taken, except when (m,n)=(0,0). The $\sin(k_{00} \cdot r)$ term is not taken since that term would equal zero. Therefore, the first line of (5a) can be more explicitly written as:

$$U(r) = \alpha_{00} + \sum_{\substack{n=1 \\ \|k_{0n}\| \leq k_{MAX}}}^{N} \{\alpha_{0n} \cos(k_{0n} \cdot r) + \beta_{0n} \sin(k_{0n} \cdot r)\} + \qquad (5b)$$

$$\sum_{m=1}^{M} \sum_{\substack{n=-N \\ \|k_{mn}\| \leq k_{MAX}}}^{N} \{\alpha_{mn} \cos(k_{mn} \cdot r) + \beta_{mn} \sin(k_{mn} \cdot r)\}$$

Only the terms that satisfy:

$$\frac{m^2}{\Lambda_x^2} + \frac{n^2}{\Lambda_y^2} \leq \frac{k_{MAX}^2}{(2\pi)^2} \qquad (6)$$

are taken in the summations in Equation (5). Equations (5) and (6) assume a rectangular array of unit cells of size $\Lambda_x$ by $\Lambda_y$. It is possible to generalize (5) and (6) for arrays that are not rectangular. For example, a honeycomb is not a rectangular array, meaning the centers of its unit cells do not lie on lines that intersect each other at right angles. For simplicity, non-rectangular arrays are not treated.

There are no more than $(2M+1)(2N+1)$ terms in the series in Equation (5b). Most significantly, the latent image can be uniquely reconstructed from no more than $(2M+1)(2N+1)$ real-valued coefficients ($\alpha_{mn}$ and $\beta_{mn}$). In other words, the latent image is represented by no more than $(2M+1)(2N+1)$ real numbers.

The image of a periodic pattern can also be represented by finitely many samples of the image according to the Nyquist Sampling Theorem. The image can be sampled at points on a rectangular grid:

$$s_{pq} = U(x_0 + pdx, y_0 + qdy); \quad p = 1, 2, \ldots, P; \quad q = 1, 2, \ldots, Q \qquad (7)$$

$$dx = \frac{\Lambda_x}{P} < \frac{\pi}{k_{MAX}}$$

$$dy = \frac{\Lambda_y}{Q} < \frac{\pi}{k_{MAX}}$$

The distances dx and dy are the sampling intervals along the x and y axes, respectively. The integer indices p and q indicate that the image intensity at the point $(x_0+pdx, y_0+qdy)$ is $s_{pq}$. The coordinate $(x_0,y_0)$ is any convenient origin in the computation domain. According to Nyquist theorem, the samples $s_{pq}$; p=1,2, ..., P; q=1,2, ..., Q uniquely determine the Fourier coefficients ($\alpha_{mn}$, $\beta_{mn}$) and vice versa. The Fourier coefficients are related to the samples by the linear equation:

$$s = [AB]\begin{bmatrix}\alpha \\ \beta\end{bmatrix} \qquad (8)$$

where $s \in R^{(PQ)}$ is a column vector containing the samples $$s = \begin{bmatrix} s_{11} \\ s_{21} \\ \vdots \\ s_{PQ} \end{bmatrix} \quad (9)$$

The vector $$\begin{bmatrix} \alpha \\ \beta \end{bmatrix}$$

of Fourier coefficients has two partitions:

$$\alpha = \begin{bmatrix} \alpha_{00} \\ \alpha_{01} \\ \vdots \\ \alpha_{0N} \\ \alpha_{1,-N} \\ \vdots \\ \alpha_{M,N} \end{bmatrix}; \beta = \begin{bmatrix} \beta_{01} \\ \vdots \\ \beta_{0N} \\ \beta_{1,-N} \\ \vdots \\ \beta_{M,N} \end{bmatrix}; \quad (10)$$

There are no entries in the column vectors α and β corresponding to the indices m, n for which:

$$\frac{m^2}{\Lambda_x^2} + \frac{n^2}{\Lambda_y^2} > \frac{k_{MAX}^2}{(2\pi)^2}.$$

The number of entries in $$\begin{bmatrix} \alpha \\ \beta \end{bmatrix}$$

are less than or equal to, and typically less than, (2M+1)(2N+1). The coefficient matrix [A B] has two partitions. The entries of partition A and B are:

$$A_{p,q;m,n} = \cos\left((x_0 + pdx)\frac{2\pi m}{\Lambda_x} + (y_0 + qdy)\frac{2\pi n}{\Lambda_y}\right) \quad (11)$$

$$B_{p,q;m,n} = \sin\left((x_0 + pdx)\frac{2\pi m}{\Lambda_x} + (y_0 + qdy)\frac{2\pi n}{\Lambda_y}\right)$$

The indices p,q are mapped to a row number and the indices m,n are mapped to a column number. There are no columns in A and B corresponding to the indices m, n for which:

$$\frac{m^2}{\Lambda_x^2} + \frac{n^2}{\Lambda_y^2} > \frac{k_{MAX}^2}{(2\pi)^2}.$$

The Fourier coefficients can be obtained from the samples as follows:

$$\begin{bmatrix} \alpha \\ \beta \end{bmatrix} = Cs \quad (12)$$

$$C = ([AB]^T[AB])^{-1}[AB]^T$$

The intensity at any point is calculated by the Fourier series:

$$U(x, y) = G(x, y)s \quad (13)$$

$$G = [\, D(x, y) \quad E(x, y)\,]C$$

$$D_{m,n}(x, y) = \cos\left(\frac{2\pi mx}{\Lambda_x} + \frac{2\pi ny}{\Lambda_y}\right)$$

$$E_{m,n}(x, y) = \sin\left(\frac{2\pi mx}{\Lambda_x} + \frac{2\pi ny}{\Lambda_y}\right)$$

The row vector D has as many entries as the column vector α. The indices m, n are mapped to the column index of D. The row vector E has as many entries as the column vector β. The indices m, n are mapped to the column index of E. The row vectors D and E, and the row vector G depend on the position (x,y) at which the image intensity is evaluated. There are no entries in D and E corresponding to the indices m, n for which:

$$\frac{m^2}{\Lambda_x^2} + \frac{n^2}{\Lambda_y^2} > \frac{k_{MAX}^2}{(2\pi)^2}.$$

Figure 2:
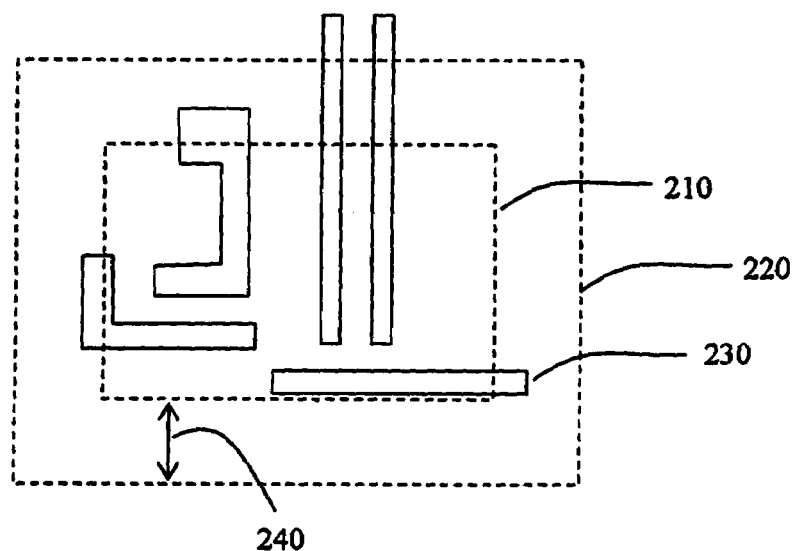
FIG. 2 is a schematic diagram of a computation domain and a karo containing a pattern.

The image of any pattern in a karo can be approximated by the image of a periodic pattern. This is illustrated by FIG. 2. A karo 210 is a subset of a target pattern that is evaluated for printability. Each karo is evaluated separately. The union of karos cover the part of the patterned layer that is subject to evaluation, which may be all of a patterned layer. Karos may overlap, or they may be disjoint. Each karo 210 is embedded in a corresponding computation domain 220. Target polygon 230 is a part of the target layout to be patterned on the wafer. At any point on the boundary of a karo, the distance 240 to the boundary of the computation domain is greater than or equal to the length of optical influence which is on the order of 3λ/NA. The image of the pattern calculated in the karo is not influenced by the pattern outside the computation domain. Therefore, the pattern can be assumed to repeat periodically outside the computation domain. This approximation has negligible influence on the image calculated at points inside the karo, if the buffer distance 240 is large enough. This approximation allows the representation of the image in the karo by a finite Fourier series as in Equation (5).

In the preferred embodiment, target points are placed in the karo and no target points are placed outside the karo. The reason for this is that the image calculated outside the karo is potentially inaccurate due to the periodicity assumption.

Some polygons in the target layout may intersect the boundary of the karo 210 and/or the boundary of the computation domain 220. Effectively, in the image calculation, the polygons are clipped or cut at the boundary of the computation domain 220, and the pattern in the computation domain is stepped and repeated endlessly. No clipping of polygons occurs at the boundary of the karo 210.

In case the pattern is actually periodic, the distance 240 is zero; the karo, the computation domain, and a unit cell of periodic pattern are one and the same.

Next, the feasibility of the design requirements will be treated. The design requirements can be expressed as:

$$Ws \leq h \quad (14)$$

$$W = \begin{bmatrix} -G(r_1 + \Delta en_1) \\ -G(r_2 + \Delta en_2) \\ \vdots \\ G(r_1 - \Delta en_1) \\ G(r_2 - \Delta en_2) \\ \vdots \\ -I \\ I \end{bmatrix}; h = \begin{bmatrix} -t/[1-(\Delta dose)/dose] \\ -t/[1-(\Delta dose)/dose] \\ \vdots \\ t/[1+(\Delta dose)/dose] \\ t/[1+(\Delta dose)/dose] \\ \vdots \\ \mathbf{0} \\ \mathbf{1}U_{MAX} \end{bmatrix} \quad (15)$$

In inequality (14), $Ws \leq h$ means each entry of the column vector on the left-hand-side is less than or equal to the corresponding entry of the column vector on the right-hand-side. In Equation (15), the number of columns of the identity matrix I is equal to the number of samples (length of vector s). The bold symbol 0 stands for a column vector such that its every entry is 0. The bold symbol 1 stands for a column vector such that its every entry is 1. The positive number $U_{MAX}$ is an upper bound for intensity at any point in the image. In a preferred embodiment, image intensity is normalized by the image intensity for a clear mask. Therefore, $U_{MAX}$ is on the order of, but larger than, 1. The image intensity can exceed 1 due to constructive interference, especially when the illumination is highly coherent. For example, for annular illumination, $U_{MAX}=1.2$ is possible.

Inequality (14), $Ws \leq h$, may or may not have a feasible set. Meaning, there may be no vector of samples s for which $Ws \leq h$ is true. In that case, it can be said the inequality $Ws \leq h$ and the design requirements are infeasible. If $Ws \leq h$ is infeasible, there can be no image, and no photomask design for which the design requirements will be met. Applying sub-resolution assist features, using an alternating-aperture phase-shift mask (AA-PSM), using a custom optimized illumination, or using the double-dipole method will not change the condition of infeasibility.

Checking the feasibility of an inequality is a well developed numerical method because it occurs in linear and quadratic programming. Fourier-Motzkin algorithm is one of the algorithms that are used to determine the feasibility of a system of linear inequalities (see, for example, Pablo A. Parrilo and Sanjay Lall, "Linear Inequalities and Elimination," Workshop presented at the 42nd IEEE Conference on Decision and Control, Maui Hi., USA, Dec. 8th, 2003). In an alternative embodiment, determining the feasibility of $Ws \leq h$ is transformed into a linear programming problem by the following transformation:

$$\min t \quad (16)$$

$$\tilde{W}\tilde{x} = h$$

$$\tilde{x} \geq 0$$

$$\tilde{W} = [W \ -W \ I \ h]$$

$$\tilde{x} = \begin{bmatrix} s_+ \\ s_- \\ \xi \\ t \end{bmatrix}$$

$$s = s_+ - s_-$$

In (16), the vectors s, $s_+$, $s_-$ and $\xi$ have the same dimensions. All entries of the vectors $s_+$, $s_-$ and $\xi$ are non-negative; t is a non-negative scalar variable. The constraints of the minimization in (16) have a feasible starting point:

$$\tilde{x} = \begin{bmatrix} s_+ \\ s_- \\ \xi \\ t \end{bmatrix} = \begin{bmatrix} 0 \\ 0 \\ 0 \\ 1 \end{bmatrix}.$$

The vector $\tilde{x}$ is not to be confused with the x-coordinates. Its entries are dimensionless, normalized image intensities. The linear cost function t in (16) attains a unique minimum t* at a solution $\tilde{x}^*$. $Ws \leq h$ is feasible if and only if all entries of the vector $\xi^* + ht^*$ are non-negative. The linear programming problem (16) can be solved using the Simplex Method (Linear Programming and its Extensions, George Danzig, Princeton University Press, 1993) or using Interior-point methods (Karmarkar, N. "A New Polynomial-Time Algorithm for Linear Programming." *Combinatorica* 4, 373-395, 1984; S. Mehrotra, "On the implementation of a primal-dual interior point method," SIAM Journal on Optimization, 2 (1992), pp. 575-601.)

Figure 3A:
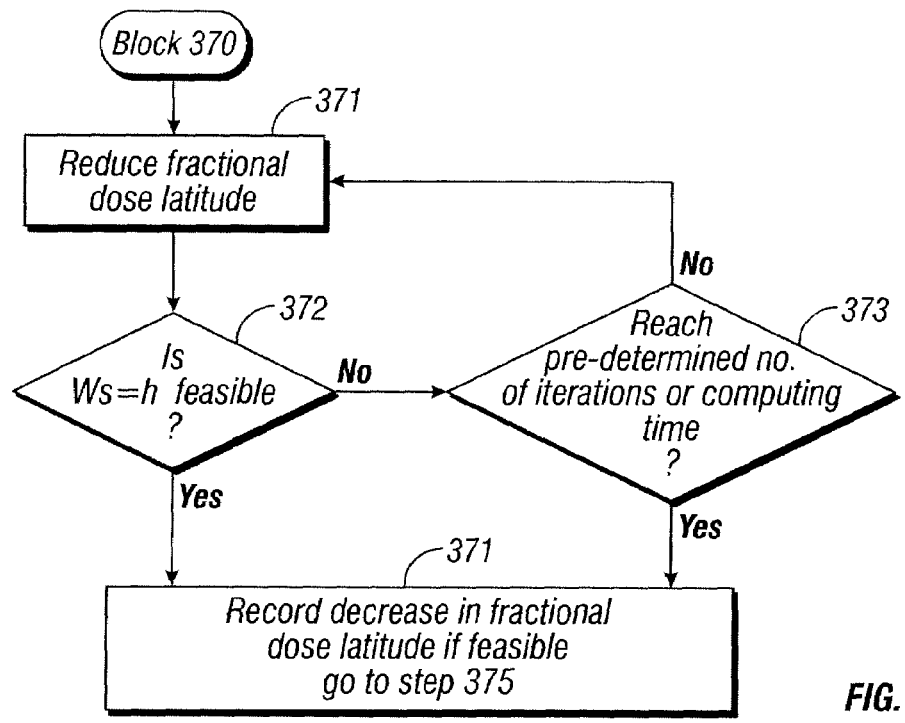
FIG. 3a is a flow chart of a routine in accordance with an alternative embodiment of the invention.
Figure 3B:
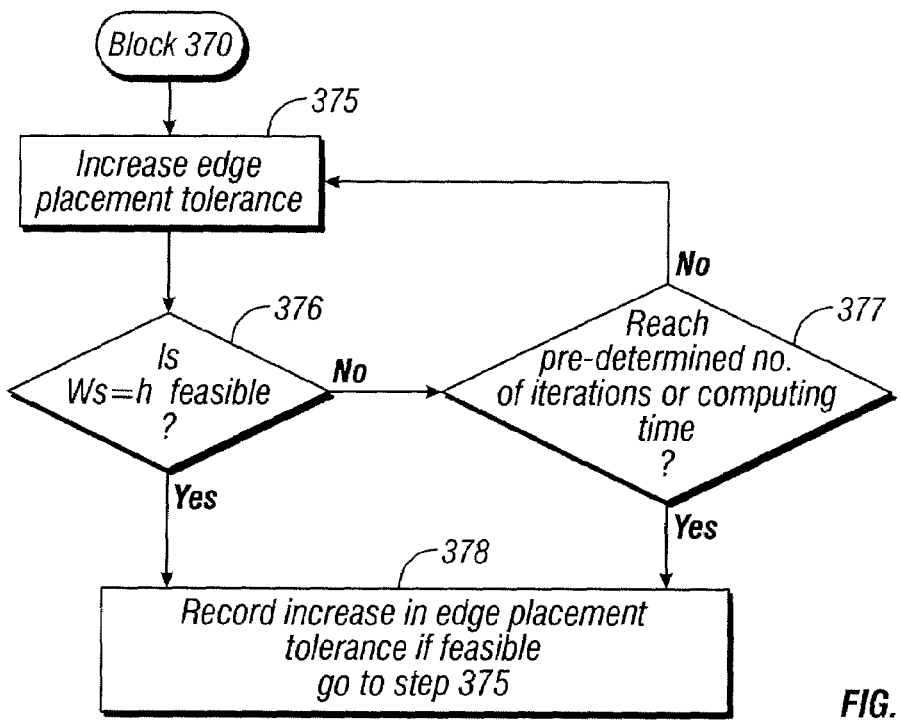
FIG. 3b is a flow chart of a routine in accordance with another embodiment of the invention.
Figure 4:
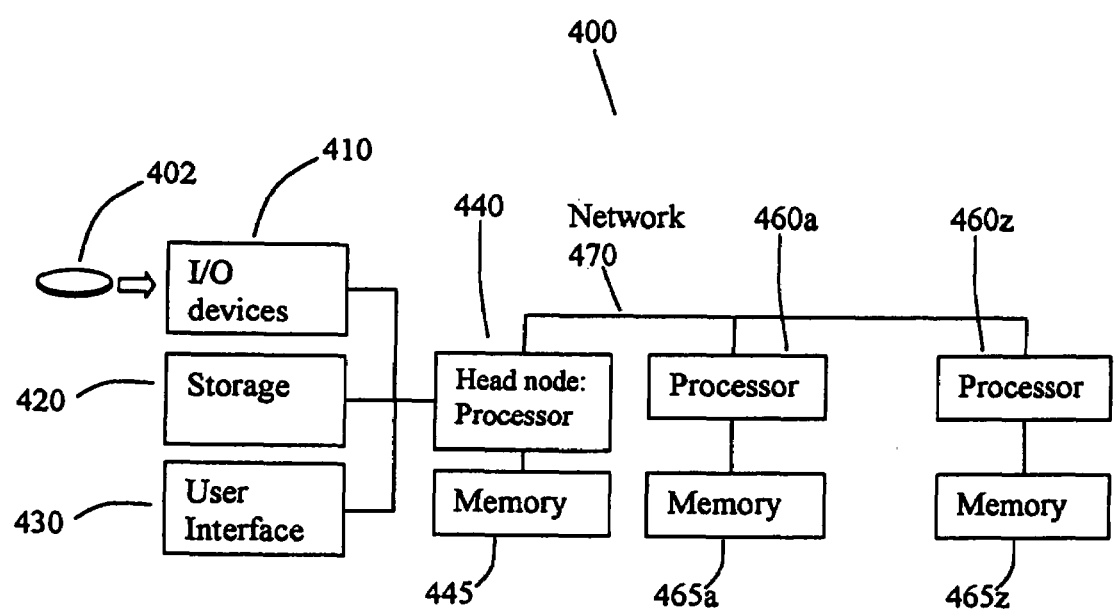
FIG. 4 is a block diagram of an apparatus in accordance with an embodiment of the invention.

FIG. 3 is a flow chart of a routine that can be used for controlling a processor or processors, such as the processors of FIG. 4, for implementing an embodiment of the invention. The routine starts at 310, and block 320 represents selecting a karo and its buffer zone, which together make up a computation domain. Target points are selected in the karo, as represented by 330. The coefficient matrix and the right hand side of the inequality $Ws \leq h$ are formed and stored, as represented by block 340, according to Equation (15). Determination is then made (decision block 360) regarding the feasibility of the inequality $Ws \leq h$. If $Ws \leq h$ is not feasible, the karo is marked as not printable (block 370) and the result is reported in a log file. If there is a feasible set, the karo is marked as "printable" (block 375). Determination is then made (decision block 380) as to whether any other region of the target layout remains to be checked. If there are no other regions to be checked, the routine terminates at (block 390). Otherwise, block 320 is re-entered where a yet unchecked karo is selected, and the routine repeats until all regions of interest of the target pattern are checked.

In an alternative embodiment shown in FIG. 3a, at step 370, when a karo is found to be not printable, ($\Delta$dose)/dose, i.e., the fractional dose latitude is reduced as indicated in block 371; and the feasibility of $Ws \leq h$ is checked again in block 372. The steps of reducing and checking are repeated until one of the following happens: a dose latitude at which $Ws \leq h$ is feasible is found; or a predetermined number of iterations or computation time is reached, as shown in block 373. The resulting reduced ($\Delta$dose)/dose is recorded as shown in block 374. Thus, in this embodiment, not only is a weak area located, but its dose latitude is also evaluated for the given edge-placement tolerance.

In another embodiment shown in FIG. 3b, at step 370, when a karo is found to be not printable, the edge placement tolerance, $\Delta e$, is increased as shown in block 375, and the feasibility of $Ws \leq h$ is checked again in block 376. The steps of increasing and checking are repeated until one of the following happens: an edge-placement tolerance at which $Ws \leq h$ is feasible is found; or a predetermined number of iterations or computation time is reached, as indicated in block 377. The resulting increased $\Delta e$ is recorded as shown in block 378. Thus, in this embodiment, not only is a weak area located, but its edge placement error is also evaluated for a given dose latitude.

Although $k_{MAX}$ does not explicitly appear in Equation (15) or (13), the feasibility of $Ws \leq h$ is determined by $k_{MAX}$. This is because $k_{MAX}$ effects A, B, D, E, and consequently W, through condition (6). In an alternative embodiment, feasibility is determined for a value of $k_{MAX}$ that is less than $4\pi NA/\lambda$, such as:

$$k_{MAX} = \frac{4\pi NA}{\lambda(1 + \text{safety margin})} \quad (17)$$

safety margin > 0

In this alternative embodiment, when a pattern is determined to be printable, it is printable with a safety margin.

In a preferred embodiment hereof, the printability is checked during the layout and routing of the physical layout of an integrated circuit. If part of any layer of the circuit is found to be not printable, the layout and routing is changed until it becomes printable.

FIG. 4 is a block diagram of an apparatus 400 that can be used in practicing an embodiment of the invention. The method described above is coded as instructions, in a machine readable format, stored in a medium 402, such as a CD, DVD, magnetic disk or tape. The instructions are loaded onto memory 445 of a processor 440 through an I/O device 410. Alternatively, the instructions can be loaded on the machine via a network. The processor 440 has storage system 420 that stores the target layout and the output data that indicates which regions are unprintable. The processor 440 has user interface 430 such as a keyboard, mouse, and screen. Alternatively, the user interface can be on a remote computer linked to system 400 via a network. The processor 440 has memory 445 to store at least part of the target layout, instructions, and results of intermediate calculations. In a preferred embodiment, processor 440 can be one of many processors 440, 460a, . . . , 460z linked by a high-speed network 470. Processor 440 acts as a head node, which means, it divides up the computation into parts that can be performed in parallel, and assigns each part to one of the parallel processors 460. Upon completion of the said part of the computation, processor 460 sends the result through network 470 back to the head node 440, which collects all such outputs and stores the end result in a file in storage 420. Head node 440 may assign a new karo to be checked to a processor 440 when it becomes available. Performing the computation in parallel reduces the overall turn-around time of the computation. Each processor 460 has associated memory 465a, . . . , 465z. Optionally, each processor 460 may have its own storage device (not shown). In an alternative embodiment, all of the computation is performed on one computer 440 and further processors 460 are not present.

Alternative Embodiment

In a preferred embodiment hereof, the left hand side of the inequality is formed in terms of Fourier coefficients, $\alpha$ and $\beta$. The intensity at any point (x,y) can be expressed as:

$$U(x, y) = [\, D(x, y) \quad E(x, y)\,]\gamma \quad (18)$$

$$\gamma = \begin{bmatrix} \alpha \\ \beta \end{bmatrix}$$

D and E are as defined in Equation (13). The intensity at Nyquist sampling points (Equation 9) can be written as $$s = [AB]\gamma,$$

where A and B are defined in Equation (11). In addition to the edge-constraints defined in Equation (1), we can also enforce constraints on the intensity values at Nyquist sampling points to ensure that the image intensity is not marginally close to the threshold t in regions where it is intended to be dark or bright:

At the Nyquist points in regions of the image that are intended to be dark, image intensity must be greater than or equal to zero, and less than a pre-selected threshold $t_L$ which in turn is less than or equal to the threshold t in Equation (1).

At the Nyquist points in features that are intended to be bright, image intensity must be less than $U_{MAX}$, and greater than a pre-selected threshold $t_U$ which in turn is greater than or equal to t.

If a Nyquist sample point is closer to an edge of a feature than a predetermined distance $\delta$, then the image intensity at that Nyquist sample point is constrained to be between 0 and $U_{MAX}$. In an alternative embodiment, no constraint is enforced at such a Nyquist sample point.

Let $s_D$ be the array (vector) of intensities at the Nyquist points in dark regions, $s_B$ be the array of intensities at those points in bright regions, and $s_C$ be the intensities at those points close to the edges of polygons. We enforce the following constraints on the intensities at the Nyquist sample points:

$$0 \leq s_D \leq t_L < t < t_U \leq s_B \leq U_{MAX} \quad (19)$$

$$0 \leq s_C \leq U_{MAX}$$

In a preferred embodiment, the thresholds $t_L$ and $t_U$ are selected as follows:

$$t_L = \frac{t}{1 + \eta \frac{\Delta \text{dose}}{\text{dose}}} \quad (20)$$

$$t_U = \frac{t}{1 - \eta \frac{\Delta \text{dose}}{\text{dose}}}$$

$$n > 1$$

In a preferred embodiment, the dimensionless factor $\eta$ is an increasing function of the distance $\delta$, which is the smallest possible distance between the Nyquist sampling points designated bright or dark, and an edge of a feature. Typically, $\eta$ is between 1 and 2.

The constraints at the Nyquist sample points, and the edge-constraints in Equation (1) can be put together to form a system of inequalities:

$$K(r + \Delta en)\gamma \leq 1 U_{MAX} \quad (21)$$

$$-K(r + \Delta en)\gamma \leq -t/[1 - (\Delta \text{dose})/\text{dose}]$$

$$K(r + \Delta en)\gamma \leq -t/[1 + (\Delta \text{dose})/\text{dose}]$$

-continued $$-K(r - \Delta en)\gamma \leq 0$$

$$H_D\gamma \leq t/[1 + \lambda(\Delta\text{dose})/\text{dose}]$$

$$-H_D\gamma \leq 0$$

$$H_B\gamma \leq 1 U_{MAX}$$

$$-H_B\gamma \leq -t/[1 - \lambda(\Delta\text{dose})/\text{dose}]$$

$$H_C\gamma \leq 1 U_{MAX}$$

$$-H_C\gamma \leq 0$$

In the above inequalities, H=[AB], and K(x,y)=[D(x,y) E(x,y)]. The matrix K has as many rows as target points placed at the edges of the features. The matrix $H_D$ has as many rows as the number of Nyquist sampling points in features that are intended to be dark. The matrix $H_B$ has as many rows as the number of Nyquist sampling points in features that are intended to be bright. The matrix $H_C$ has as many rows as the number of Nyquist sampling points that are closer than $\delta$ to an edge of a feature. Each line of (20) is a vector (array) of inequalities. By concatenating the rows of (20) in to one matrix inequality, we obtain:

$$W\gamma \leq h \qquad (22)$$

W and h in (21) are different from the ones in the embodiment described by Equation (15).

The embodiment described by Equations (14-15), and the embodiment described by Equations (20-21) both involve determining the feasibility of a system of inequalities. Feasibility of a system of inequalities can be determined by any of several methods. Among these methods are: Fourier-Motzkin algorithm; linear programming methods such as the Simplex method or the interior-point methods as described above. Below, we describe two algorithms for determining the feasibility of a system of inequalities. Both of these algorithms are more efficient than linear programming.

Algorithm (A) for Determining the Feasibility of $W\gamma \leq h$

We first introduce a vector of non-negative slack variables, $\xi$, to transform the inequality constraint into an equality constraint:

$$W\gamma + \xi = h; \qquad (23)$$

$$\xi \geq 0$$

The system of inequalities $W\gamma \leq h$ is feasible if and only if there exists a slack vector $\xi$ of non-negative entries which puts $h-\xi$ in the range-space of matrix W. Thus determining the feasibility of the system of inequalities is the same as determining if these two convex sets intersect:

$$C_1 = \{\xi | \xi \geq 0\} \text{ and}$$

$$C_2 = \{\xi | (\xi - h) \in \text{RangeSpace}(W)\} \qquad (24)$$

Let's call the orthogonal projectors of $C_1$ and $C_2$, $P_1$ and $P_2$, respectively. A point in the intersection of two convex sets can be found by successive, alternating projections on to the two convex sets. To form $P_2$, we do the QR-factorization of W=QR where columns of Q are orthonormal and R is an upper-triangular, square matrix of size rank(W). (Matrix Computations, G. H. Golub and C. F. Van Loan, Section 6.4, John Hopkins University Press, 1983). The steps of algorithm A are as follows:

1. Initialize $\xi^{(0)}=0$, and define the vector $\theta=(I-QQ^T)h$
2. Iterate the following until convergence, or until a maximum number of iterations is reached:

$$\xi^{(k+1)}=P_1(P_2(\xi^{(k)}))=\max(0, \theta+QQ^T\xi^{(k)}); k=0,1,2,\ldots$$

In a preferred embodiment, the criterion is $\xi > -\epsilon$, where $\epsilon$ is a small normalized-intensity tolerance such as 0.001.

3. Calculate the Fourier coefficients: $\gamma = R^{-1}Q^T(h-\xi)$ and the image intensity: $H\gamma$.
4. Check if any entries of the inequality $\xi > -\epsilon$ are violated. If so, record or graphically display the corresponding edge target points or Nyquist sample points where the constraints are violated.

In case of infeasibility, the convex sets $C_1$ and $C_2$ do not intersect, and the above equation converges to a realizable image intensity that is closest to satisfying the constraints. In case of infeasibility, at least some edge target points or Nyquist sample points are flagged. This indicates which features in the layout are infeasible in a location specific manner.

Algorithm (B) for Determining the Feasibility of $W\gamma \leq h$

In an alternative embodiment hereof, feasibility is determined by nonlinear minimization. The quantity that is minimized is:

$$\min_{\gamma} \|\min(0, h - W\gamma)\|^2 \qquad (25)$$

In (25), $\|x\|^2 = x^T x$ stands for the square of the $l_2$-norm of a vector. The min operator inside the norm selects, entry-by-entry, the lesser of 0 or the entry of the vector $h-W\gamma$. The minimal value of the norm is 0 if and only if $W\gamma \leq h$ is feasible. The minimization algorithm can be solved by one of many optimization algorithms. In a preferred embodiment, (25) is minimized by the Gauss-Newton algorithm, which is useful for minimizing sum of squares. To this end, we define the vector-valued residual $f(\gamma)$ and its Jacobian matrix J:

$$f(\gamma) = \min(0, h - W\gamma) \qquad (26)$$

$$J_{ij} = \frac{\partial f_i}{\partial \gamma_j} = \begin{cases} 0 & \text{if } f_i = 0 \\ -W_{ij} & \text{otherwise} \end{cases}$$

The steps of algorithm B are as follows:
1. Initialize vector $\gamma^0$. In a preferred embodiment, $$\gamma^0 = \arg\min_{\zeta} \|h - W\zeta\|^2.$$

In an alternative embodiment, $\gamma^0=0$.

2. Iterate the following until convergence or until a maximum number of iterations is reached:

$$\gamma^{k+1} = \gamma^k + \arg\min_{\zeta} \|J(\gamma^k)\zeta + f(\gamma^k)\|, k = 0, 1, 2, \ldots$$

3. Calculate the image intensity Hγ.
4. Check if any entries of Wγ≦h are violated. If so, record or graphically display the corresponding edge target points or Nyquist sample points where the constraints are violated.

In the above iteration, argmin stands for: "the argument that minimizes the following function." Said minimization, which is a linear least squares problem, is with respect to the dummy vector ζ. The vector $\gamma^k$ remains constant during the minimization in step 2. The solution of the linear least squares problem $$\min_\zeta \|J(\gamma^k)\zeta + f(\gamma^k)\|$$

is well known (See: Matrix Computations, G. H. Golub and C. F. Van Loan, Chapter 6, John Hopkins University Press, 1983). In a preferred embodiment, the stopping criterion is: $\|f(\gamma^k)\|<\epsilon$, for some small, normalized-image intensity ε such as 0.001. In case of infeasibility, at least some edge target points or Nyquist sample points are flagged. This indicates which features in the layout are infeasible in a location-specific manner.

The invention as been described with reference to particular preferred embodiments, but variations within the spirit and scope of the invention will occur to those skilled in the art. For example, the present invention is applicable to reflective as well as transmissive photomasks. Reflective masks are required in extreme-ultra-violet (EUV) wavelengths. EUV lithography operates at about 13.5 nm exposure-wavelength. EUV masks are typically formed by alternately depositing thin films of two materials of dissimilar refractive indices, such as molybdenum and silicon. The periodic structure formed by the stack of alternating films has a stop-band which reflects the incoming radiation. The photomask pattern is etched into an absorptive film, such as aluminum, deposited on top of the reflective stack of alternating films (see: Stephen P. Vernon, et al., "Masks for extreme ultraviolet lithography," Proc. SPIE Vol. 3546, p. 184-193, December 1998, SPIE Press, Bellingham, Wash.).

The present invention is also applicable to mask-less lithography, wherein the photomask is replaced by a spatial light modulator. The spatial light modulator has an array of pixels each of which can modulate light that falls on it. The pixels are controlled according to the photomask data. The spatial light modulator typically comprises an array of micro-machined mirrors. The spatial light modulator is illuminated and its image is projected by an objective on to the wafer (see U.S. Pat. No. 6,700,095).

The present invention is also applicable to immersion lithography, wherein a transparent fluid such as water fills the gap between the last lens of the projection objective and the photoresist film on the semiconductor wafer. The refractive index of the fluid is higher than that of air.

The present invention is equally applicable to binary masks, attenuated-phase-shift masks, alternating aperture phase-shift masks, and multi-tone masks (masks having at least three portions of distinct transmission or reflection coefficients).

The invention claimed is:

1. A computer implemented method of testing a target layout data set for a circuit design of an integrated circuit, wherein the target layout data set represents a layer to be patterned onto a semiconductor wafer using a photolithographic imaging process, the method comprising the steps of:

generating a first data set of a plurality of points at predetermined locations on a layer of the target layout;

generating a second data set of acceptable intensity thresholds at corresponding points on the layer of the target layout;

applying a plurality of sampling coefficients representing an optical property of the image to the first data set on the layer to derive a range of intensities at the corresponding points; and using a processor to compare intensities across the range of intensities at the predetermined points to the intensity thresholds for those points to determine printability of the target layout.

2. The method of claim 1, wherein the plurality of known sampling coefficients comprises Fourier coefficients representing degrees of freedom in image intensities of the photolithographic imaging process.

3. The method of claim 1, wherein the plurality of known sampling coefficients comprises finite samples defining image intensities for the photolithographic imaging process.

4. The method of claim 1, wherein the acceptable intensity thresholds at corresponding points comprise intensity thresholds at points that are at a predetermined distance from an edge of a feature in the layout.

5. The method of claim 4, wherein the a threshold is selected as $$\frac{t}{1-\eta\frac{\Delta dose}{dose}!},$$

where Δdose is an acceptable range of exposure dose variability and η is an increasing function of the distance from the edge of a feature in the layout.

6. The method of claim 4, wherein a second threshold is selected as $$\frac{t}{1+\eta\frac{\Delta dose}{dose}!},$$

where Δdose is an acceptable range of exposure dose variability and η is an increasing function of the distance from the edge of a feature in the layout.

7. The method of claim 1, further comprising the steps of adjusting a fractional dose latitude for a portion of the target layout that is determined to not be printable and rechecking printability of the portion of the target layout, wherein the steps of adjusting and rechecking are repeated until a dose latitude at which printability is feasible is determined.

8. The method of claim 1, further comprising the steps of adjusting an edge placement tolerance for a portion of the target layout that is determined to not be printable and rechecking printability of the portion of the target layout, wherein the steps of adjusting and rechecking are repeated until an edge-placement tolerance at which printability is feasible is determined.

9. The method of claim 1, wherein the printability of the target layout is checked during layout and routing of the integrated circuit.

10. The method of claim 9, wherein printability of the target layout is checked during layout and routing of the integrated circuit and is repeated until printability is achieved, thereby arriving at a printable layout before performing optical proximity correction.

11. The method of claim 1, wherein the second data set of acceptable intensity thresholds at corresponding points on the layer of the target layout comprises information indicating whether each point is intended to be bright or dark.

12. An apparatus for testing a target layout data set for a circuit design of an integrated circuit, wherein the target layout data set represents a layer to be patterned onto a semiconductor wafer using a photolithographic imaging process, the apparatus including:
  a processor for generating a first data set of a plurality of points at predetermined locations on a layer of the target layout;
  a processor for generating a second data set of acceptable intensity thresholds at corresponding points on the layer of the target layout;
  a memory for storing a plurality of known sampling coefficients representing an optical property of the image of the first data set on the layer to derive a range of intensities at the corresponding points, wherein the processor for generating first data set applies the plurality of known sampling coefficients and derives a range of intensities at the corresponding points; and
  a processor for comparing intensities across the range of intensities at the predetermined points to the intensity thresholds for those points to determine printability of the target layout.

13. The apparatus of claim 12, wherein the plurality of known sampling coefficients comprises Fourier coefficients representing degrees of freedom in image intensities of the photolithographic imaging process.

14. The apparatus of claim 12, wherein the plurality of known sampling coefficients comprises finite samples defining image intensities for the photolithographic imaging process.

15. The apparatus of claim 12, wherein the acceptable intensity thresholds at corresponding points comprise intensity thresholds at points that are at a predetermined distance from an edge of a feature in the layout.

16. The apparatus of claim 15, wherein the wherein a first threshold is selected as $$\frac{t}{1-\eta\frac{\Delta dose}{dose}!},$$

where $\Delta dose$ is an acceptable range of exposure dose variability and $\eta$ is an increasing function of the distance from the edge of a feature in the layout.

17. The apparatus of claim 15, wherein a second threshold is selected as $$\frac{t}{1+\eta\frac{\Delta dose}{dose}!},$$

where $\Delta dose$ is an acceptable range of exposure dose variability and $\eta$ is an increasing function of the distance from the edge of a feature in the layout.

18. The apparatus of claim 12, further comprising a processor for adjusting a fractional dose latitude for a portion of the target layout that is determined to not be printable and rechecking printability of the portion of the target layout, wherein the steps of adjusting and rechecking are repeated until a dose latitude at which printability is feasible is determined.

19. The apparatus of claim 12, further comprising a processor for adjusting an edge placement tolerance for a portion of the target layout that is determined to not be printable and rechecking printability of the portion of the target layout, wherein the steps of adjusting and rechecking are repeated until an edge-placement tolerance at which printability is feasible is determined.

20. The apparatus of claim 12, wherein the printability of the target layout is checked during layout and routing of the integrated circuit.

21. The apparatus of claim 12, wherein printability of the target layout is checked during layout and routing of the integrated circuit and is repeated until printability is achieved, thereby arriving at a printable layout before performing optical proximity correction.

22. The apparatus of claim 12, wherein the second data set of acceptable intensity thresholds at corresponding points on the layer of the target layout comprises information indicating whether each point is intended to be bright or dark.

23. A computer-readable storage media including computer-executable instructions for testing a target layout data set for a circuit design of an integrated circuit, wherein the target layout data set represents a layer to be patterned onto a semiconductor wafer using a photolithographic imaging process, the instructions comprising the steps of:
  generating a first data set of a plurality of points at predetermined locations on a layer of the target layout;
  generating a second data set of acceptable intensity thresholds at corresponding points on the layer of the target layout;
  applying a plurality of known sampling coefficients representing an optical property of the image to the first data set on the layer to derive a range of intensities at the corresponding points; and
  comparing intensities across the range of intensities at the predetermined points to the intensity thresholds for those points to determine printability of the target layout.

24. The computer-readable storage media of claim 23, wherein an array of known sampling coefficients comprises Fourier coefficients representing degrees of freedom in image intensities of the photolithographic imaging process.

25. The computer-readable storage media of claim 23, wherein an array of known sampling coefficients comprises finite samples defining image intensities for the photolithographic imaging process.

26. The computer-readable storage media of claim 23, wherein the acceptable intensity thresholds at corresponding points comprise intensity thresholds at points that are at a predetermined distance from an edge of a feature in the layout.

27. The computer-readable storage media of claim 26, wherein a first threshold is selected as $$\frac{t}{1-\eta\frac{\Delta dose}{dose}!},$$

where $\Delta dose$ is an acceptable range of exposure dose variability and $\eta$ is an increasing function of the distance from the edge of a feature in the layout.

28. The computer-readable storage media of claim 26, wherein the second threshold is selected as $$\frac{t}{1+\eta\frac{\Delta dose}{dose}!},$$

where $\Delta dose$ is an acceptable range of exposure dose variability and $\eta$ is an increasing function of the distance from the edge of a feature in the layout.

29. The computer-readable storage media of claim 23, further comprising the steps of adjusting a fractional dose latitude for a portion of the target layout that is determined to not be printable and rechecking printability of the portion of the target layout, wherein the steps of adjusting and rechecking are repeated until a dose latitude at which printability is feasible is determined.

30. The computer-readable storage media of claim 23, further comprising the steps of adjusting an edge placement tolerance for a portion of the target layout that is determined to not be printable and rechecking printability of the portion of the target layout, wherein the steps of adjusting and rechecking are repeated until an edge-placement tolerance at which printability is feasible is determined.

31. The computer-readable storage media of claim 23, wherein the printability of the target layout is checked during layout and routing of the integrated circuit.

32. The computer-readable storage media of claim 31, wherein printability of the target layout is checked during layout and routing of the integrated circuit and is repeated until printability is achieved, thereby arriving at a printable layout before performing optical proximity correction.

33. The computer-readable storage media of claim 23, wherein the second data set of acceptable intensity thresholds at corresponding points on the layer of the target layout comprises information indicating whether each point is intended to be bright or dark.

* * * * *

UNITED STATES PATENT AND TRADEMARK OFFICE
CERTIFICATE OF CORRECTION

PATENT NO. : 7,568,174 B2
APPLICATION NO. : 11/504928
DATED : July 28, 2009
INVENTOR(S) : Abdurrahman Sezginer et al.

It is certified that error appears in the above-identified patent and that said Letters Patent is hereby corrected as shown below:

Col. 16, line 26,
Claim 5 should read as follows:

The method of claim 4, wherein a threshold is selected as $\dfrac{t}{1-\eta\dfrac{\Delta dose}{dose}!}$, where $\Delta dose$ is an acceptable range of exposure dose variability and $\eta$ is an increasing function of the distance from the edge of a feature in the layout.

Col. 17, line 42,
Claim 16 should read as follows:

The apparatus of claim 15, wherein a first threshold is selected as $\dfrac{t}{1-\eta\dfrac{\Delta dose}{dose}!}$, where $\Delta dose$ is an acceptable range of exposure dose variability and $\eta$ is an increasing function of the distance from the edge of a feature in the layout.

Signed and Sealed this

Twenty-seventh Day of October, 2009

David J. Kappos
*Director of the United States Patent and Trademark Office*